(12) United States Patent
Nelson

(10) Patent No.: US 6,646,215 B1
(45) Date of Patent: Nov. 11, 2003

(54) DEVICE ADAPTED TO PULL A CANTILEVER AWAY FROM A CONTACT STRUCTURE

(75) Inventor: Richard D. Nelson, Austin, TX (US)

(73) Assignee: Teravicin Technologies, Inc., Austin, TX (US)

( * ) Notice: Subject to any disclaimer, the term of this patent is extended or adjusted under 35 U.S.C. 154(b) by 109 days.

(21) Appl. No.: 09/895,455

(22) Filed: Jun. 29, 2001

(51) Int. Cl.[7] ............ B81B 7/00; H01H 59/00; H01P 1/00
(52) U.S. Cl. ...................... 200/181; 333/262
(58) Field of Search ............ 200/181; 333/101–108, 333/262; 73/513.14

(56) References Cited

U.S. PATENT DOCUMENTS

| | | | |
|---|---|---|---|
| 4,543,457 A | 9/1985 | Petersen et al. | |
| 4,959,515 A | 9/1990 | Zavracky et al. | |
| 5,258,591 A | * 11/1993 | Buck | 200/181 |
| 5,367,136 A | * 11/1994 | Buck | 200/600 |
| 5,377,524 A | 1/1995 | Wise et al. | |
| 5,526,172 A | 6/1996 | Kanack | |
| 5,578,976 A | 11/1996 | Yao | |
| 5,619,061 A | 4/1997 | Goldsmith et al. | |
| 5,629,565 A | 5/1997 | Schlaak et al. | |
| 5,638,946 A | 6/1997 | Zavracky | |
| 5,673,785 A | 10/1997 | Schlaak et al. | |
| 5,867,302 A | 2/1999 | Fleming | |
| 5,994,796 A | 11/1999 | De Los Santos | |
| 6,016,092 A | 1/2000 | Qiu et al. | |
| 6,046,659 A | * 4/2000 | Loo et al. | 333/262 |
| 6,057,520 A | 5/2000 | Goodwin-Johansson | |
| 6,069,540 A | 5/2000 | Berenz et al. | |
| 6,072,686 A | 6/2000 | Yarbrough | |
| 6,100,477 A | 8/2000 | Randall et al. | |
| 6,100,862 A | 8/2000 | Sullivan | |
| 6,115,231 A | * 9/2000 | Shirakawa | 361/233 |
| 6,143,997 A | 11/2000 | Feng et al. | |
| 6,153,839 A | 11/2000 | Zavracky et al. | |
| 6,168,395 B1 | 1/2001 | Quenzer et al. | |
| 6,183,097 B1 | 2/2001 | Saif et al. | |
| 6,188,301 B1 | 2/2001 | Kornrumpf et al. | |
| 6,201,629 B1 | 3/2001 | McClelland et al. | |
| 6,204,737 B1 | 3/2001 | Ellä | |
| 6,212,314 B1 | 4/2001 | Ford | |

OTHER PUBLICATIONS

Hyman et al., "Contact Physics of Gold Microcontacts for MEMS Switches," © 1998 IEEE, pp. 133–140.

Majumder et al., "Measurement and Modeling of Surface Micromachined, Electrostatically Actuated Microswitches," © 1997 IEEE, pp. 1145–1148.

Majumder et al., "Study of Contacts in an Electrostatically Actuated Microswitch," © 1998 IEEE, pp. 127–132.

Zavracky et al., "Microswitches and Microrelays with a New Toward Microwave Applications," © 1999 John Wiley & Sons, Inc., pp. 338–347.

(List continued on next page.)

Primary Examiner—J. R. Scott
(74) Attorney, Agent, or Firm—Kevin L. Daffer; Conley Rose P.C.

(57) ABSTRACT

A device is provided which is adapted to electrostatically pull a cantilever away from a conductive pad. In particular, a microelectromechanical device is provided which includes a fulcrum contact structure interposed between two electrodes spaced under a cantilever and a conductive pad arranged laterally adjacent to one of the electrodes. The cantilever may be brought into contact with the conductive pad by residual forces within the cantilever and/or an application of a closing voltage to one of the electrodes. Such a device may be adapted bring the cantilever in contact with the fulcrum contact structure by applying an actuation voltage to the other of the electrodes. In addition, the actuation voltage may deflect the cantilever away from the conductive pad. In some cases, deflecting the cantilever from the conductive pad may include releasing the closing voltage and increasing the actuation voltage subsequent to the release of the closing voltage.

32 Claims, 4 Drawing Sheets

OTHER PUBLICATIONS

Zavracky et al., "Micromechanical Switches Fabricated using Nickel Surface Micromachining," IEEE, pp. 3–9, Mar. 1, 1997.

Chalmers, "Relay Races," Jan. 2001, Mechanical Engineering, pp. 66–68.

Hirata et al., "A Micromechanical Switch as the Logic Elements for Circuits in Multi Chip Module on Si (MCM–Si)," 6 pages, Jan. 2000.

Petersen, "Silicon as a Mechanical Material," IEEE, pp. 420–457, May 1982.

Milanovic et al., "Microrelays for Batch Transfer Integration in RF Systems," © 2000 IEEE, pp. 787–792.

McGruer et al., "Electrostatically Actuated MicroSwitches; Scaling Properties," 1998, pp. 132–135.

* cited by examiner

DEVICE ADAPTED TO PULL A CANTILEVER AWAY FROM A CONTACT STRUCTURE

BACKGROUND OF THE INVENTION

1. Field of the Invention

This invention relates to microelectromechanical devices, and more particularly, to a microelectromechanical device in which a cantilever is electrostatically pulled away from a conductive pad.

2. Description of the Related Art

The following descriptions and examples are not admitted to be prior art by virtue of their inclusion within this section.

Microelectromechanical devices, or devices made using microelectromechanical systems (MEMS) technology, are of interest in part because of their potential for allowing integration of high-quality devices with circuits formed using integrated circuit (IC) technology. For example, MEMS switches may exhibit lower losses and a higher ratio of off-impedance to on-impedance as compared to transistor switches formed from conventional IC technology. However, a persistent problem with implementation of MEMS switches has been the high voltage required (often about 40V or higher) to actuate the switches, as compared to typical IC operating voltages (about 5V or lower).

These relatively high actuation voltages of MEMS switches are caused at least in part by a tradeoff between the closing and opening effectiveness of a given switch design. In the case of a cantilever switch, for example, approaches to lowering the actuation voltage of the switch include reducing the stiffness of the cantilever beam and reducing the gap between the beam and the underlying conductive pad. Unfortunately, these design changes typically have the effect of making opening of the switch more difficult. MEMS cantilever switch designs generally use an applied voltage to close the switch, and rely on the spring force in the beam to open the switch when the applied voltage is removed. In opening the switch, the spring force, or restoring force, of the beam must typically counteract what is often called "stiction". Stiction refers to various forces tending to make two surfaces stick together, such as van der Waals forces, surface tension caused by moisture between the surfaces, and/or bonding between the surfaces (e.g., through metallic diffusion). In general, modifications to a switch which act to lower the closing voltage also tend to make the switch harder to open, such that efforts to form a switch with a lowered closing voltage can result in a switch which may not open reliably (or at all).

Another problem with MEMS devices is that they tend to deform due to residual stresses contained within the devices. More specifically, the residual stresses within a MEMS switch may cause a beam within the device to curl either away from its underlying contact structures or toward the contact structures. In the event that the beam curls down and closes a contact prematurely, the switch may become inoperable because significant electrostatic repulsion between the gate and the beam cannot be established. In this manner, the switch may not be opened by removing an applied voltage as described above. Residual stresses typically arise when a MEMS device has layers of differing properties. For example, the device may include layers of differing materials. Alternatively or in addition, the properties of the layers may change if deposition conditions change as the layers are formed. As such, the variation of materials within conventional MEMS devices may be limited. In addition, fabrication steps may be tightly controlled such that changes in layer properties do not occur.

It would therefore be desirable to develop a MEMS device which relaxes the constraints imposed by the above-described tradeoff between opening and closing effectiveness and the presence of residual stresses within the device.

SUMMARY OF THE INVENTION

The problems outlined above may be in large part addressed by a device adapted to electrostatically pull a cantilever away from a conductive pad and a method for fabricating such a device. In particular, a microelectromechanical device is provided which includes a fulcrum contact structure interposed between two electrodes spaced under a cantilever. The device further includes a conductive pad arranged under the distal end of the cantilever and laterally adjacent to one of the electrodes. Such a device may be adapted to initially bring the cantilever in contact with the conductive pad by an application of a closing voltage to one of the electrodes. The device may be further adapted to deflect the cantilever away from the conductive pad upon an application of voltage to the other of the electrodes such that the cantilever contacts the fulcrum contact structure. In another embodiment, the device may be adapted to deflect the cantilever away from the conductive pad upon a release of the closing voltage after the application of the voltage to the other electrode. In yet another embodiment, the device may be adapted to deflect the cantilever away from the conductive pad upon an increase of the voltage applied to the other electrode after a release of the closing voltage.

In some embodiments, the cantilever may include residual forces with which to bring the cantilever in contact with the conductive pad. In such an embodiment, the application of voltage to one or both of the electrodes may pull the cantilever in contact with the fulcrum contact structure. In this manner, the device may serve as a functional switch since contact at the fulcrum structure may be made and/or released by actuating either one or both of the gate structures. In addition, the application of a voltage to an electrode interposed between the fulcrum contact structure and a support structure of the cantilever, in such an embodiment, may be sufficient to pull the cantilever apart from the conductive pad. In an alternative embodiment, the residual stresses within the cantilever may cause the beam to curl away from the conductive pad. In such an embodiment, the device may be adapted to pull the cantilever away from the fulcrum contact structure. In particular, the application of a voltage to an electrode arranged laterally adjacent to the contact pad, in such an embodiment, may be sufficient to pull the cantilever apart from the fulcrum contact structure. In addition, the device may be adapted to bring the cantilever in contact with both the conductive pad and the fulcrum contact structure.

In an embodiment, a microelectromechanical device as described above may include first and second electrodes spaced under a cantilever. In addition, the device may include a fulcrum contact structure interposed between the first and second electrodes and a conductive pad arranged under a distal end of the cantilever and laterally adjacent to the second electrode. In some embodiments, the conductive pad may be interposed between the fulcrum contact structure and the second electrode. Alternatively, the second electrode may be interposed between the fulcrum contact structure and the conductive pad. In addition, the conductive pad and/or fulcrum contact structure may include multiple sections spaced apart from each other.

The cantilever may be supported by a support structure at the end opposite the distal end of the cantilever. In some embodiments, the support structure may include an electrical terminal. The cantilever may further include an insulating element interposed between the supported end and the distal end of the cantilever. In addition or alternatively, the cantilever may have a dimpled portion above at least one of the fulcrum contact structure and conductive pad. On the other hand, the cantilever may be substantially uniform. In addition or alternatively, at least one of the fulcrum contact structure and the conductive pad may include a raised section arranged upon its respective surface. Regardless of the configuration, the spacing between the fulcrum contact structure and its overlying respective portion of the cantilever is preferably smaller than the spacing between the first and second electrodes and their overlying respective portion of the cantilever when the cantilever is not in contact with the conductive pad. As such, the cantilever may include a dimpled portion above at least the fulcrum contact structure. In addition or alternatively, an upper surface of the fulcrum contact structure may be above an upper surface of the conductive pad. On the contrary, an upper surface of the fulcrum contact structure may be below an upper surface of the conductive pad.

As stated above, a microelectromechanical device adapted to electrostatically pull a cantilever apart from a conductive pad is provided. Such a device may include first and second electrodes spaced under the cantilever and the conductive pad arranged laterally adjacent to the second electrode. In addition, the device may include a fulcrum contact structure interposed between the first and second electrodes. In one embodiment, the fulcrum contact structure may be arranged under the center point of the cantilever. Alternatively, the fulcrum contact structure may be arranged either closer to the distal end or supported end of the cantilever. In some cases, the fulcrum contact structure may include conductive material.

The device may be adapted to pull the cantilever apart from the conductive pad upon application of an activation voltage to the first electrode such that the cantilever contacts the fulcrum contact structure. in some embodiments, the device may be further adapted to initially bring the cantilever in contact with the conductive pad by an application of a closing voltage to the second electrode. In such an embodiment, the device may be adapted to pull the cantilever away from the conductive pad upon an application of an activation voltage to the first electrode. In some cases, the device may be adapted to pull the cantilever apart from the conductive pad upon a release of the closing voltage applied to the second electrode in addition to the application of the activation voltage to the first electrode. The combination of the applying the actuation voltage and releasing the closing voltage may be conducted in series or simultaneously. In an alternative embodiment, the device may be adapted to pull the cantilever apart from the conductive pad upon an increase of the activation voltage after the release of the closing voltage.

In some embodiments, the cantilever may contain residual forces, which may be adapted to initially bring the cantilever into contact with the conductive pad. An application of the closing voltage to the second electrode in such an embodiment may bring the cantilever in contact with the fulcrum contact structure. In some cases, the application of the closing voltage may be applied in combination with an application of the actuation voltage to the first electrode. Such applications of voltages may be conducted simultaneously or in series. Alternatively, contact to the fulcrum contact structure may be made only by the application of the actuation voltage to the first electrode. In either embodiment, the device may serve as a functional switch since contact may be made and/or released at the fulcrum contact structure by actuating either one or both gates. In addition, the application of the actuation voltage to the first electrode may pull the cantilever away from the conductive pad.

In an alternative embodiment, the residual forces contained within the cantilever may be adapted to curl the cantilever away from the conductive pad. In such an embodiment, the device may be adapted to initially bring the cantilever in contact with the fulcrum contact structure upon an application of an actuation voltage to the first electrode. Furthermore, the device may be adapted to initially bring the cantilever in contact with the fulcrum contact structure upon an application of an actuation voltage to the first electrode and a simultaneous application of a closing voltage to the second electrode. Additionally the device may be adapted to initially bring the cantilever in contact with both the fulcrum contact structure and the conductive pad with a simultaneous application of voltages to the first and second electrodes. In embodiments such as these, the device may be adapted to electrostatically pull the cantilever away from the fulcrum contact structure. In particular, the device may be adapted to pull the cantilever apart from the fulcrum contact structure upon an application of a closing voltage to the second electrode such that the cantilever contacts the conductive pad. In some embodiments, the device may be adapted to pull the cantilever apart from the fulcrum contact structure upon an application of a closing voltage to the second electrode, such that the cantilever contacts the conductive pad, and a release of the actuation voltage applied to the first electrode. The combination of applying the closing voltage and releasing the actuation voltage may be conducted serially or simultaneously. In an alternative embodiment, the device may be adapted to pull the cantilever apart from the fulcrum contact structure upon an increase of the closing voltage after the release of the actuation voltage.

A method for fabricating the microelectromechanical device as described above is also contemplated herein. In particular, the method may include forming a first electrode and a second electrode upon a substrate. In some cases, the width of the first electrode may be greater than the width of the second electrode. The method may continue by patterning a fulcrum contact structure between the first and second electrodes and patterning a conductive pad laterally adjacent to the second electrode. In some embodiments, the conductive pad may be interposed between the second electrode and the fulcrum contact structure. Alternatively, the second electrode may be interposed between the conductive pad and fulcrum contact structure. In some cases, the conductive pad and/or fulcrum contact structure may include raised sections upon their respective surfaces. In such an embodiment, patterning the conductive pad and/or fulcrum contact structure may include patterning a base structure of the respective structure and subsequently patterning a raised section from the upper portion of the base structure.

The method may further include forming a cantilever spaced above the first and second electrodes, conductive pad, and fulcrum contact structure. Forming the cantilever may include forming a sacrificial layer upon the first and second electrodes, the conductive pad, the fulcrum contact structure, and exposed portions of the substrate. The formation of such a sacrificial layer may include depositing the sacrificial layer upon the first and second electrodes, the conductive pad, the fulcrum contact structure, and exposed portions of the substrate. Recesses may then be etched within the deposited sacrificial layer above at least one of the conductive pad and fulcrum contact structure. Alternatively, the recesses may be formed by pattern depositing the sacrificial layer in multiple steps. The method may further include depositing a beam layer upon the sacrificial layer. Finally, the sacrificial layer may be removed such that the cantilever is spaced above the electrodes, conductive pad, and fulcrum contact structure. In addition, the method may include forming a support structure laterally adjacent to the first electrode prior to forming the cantilever. In some embodiments, the support structure may include an electrical terminal.

There may be several advantages to forming a device that is adapted to electrostatically pull a cantilever away from a conductive pad. For example, such a device may overcome the opening difficulties associated with surface tension issues, such as stiction. As such, a more flexible beam may be employed within the device. Consequently, the device may operate at lower actuating voltages, thereby making implementation with integrated circuits more feasible. In addition, the functionality of the device as described herein is not restricted by residual stresses contained within the device since a repulsive electrostatic force between the gate and beam is not required to exist in order to deflect the cantilever from the conductive pad. In other words, the device as described herein may deflect a cantilever that has bent down in contact with the conductive pad without the influence of an electrostatic force.

BRIEF DESCRIPTION OF THE DRAWINGS

Other objects and advantages of the invention will become apparent upon reading the following detailed description and upon reference to the accompanying drawings in which.

Figure 1:
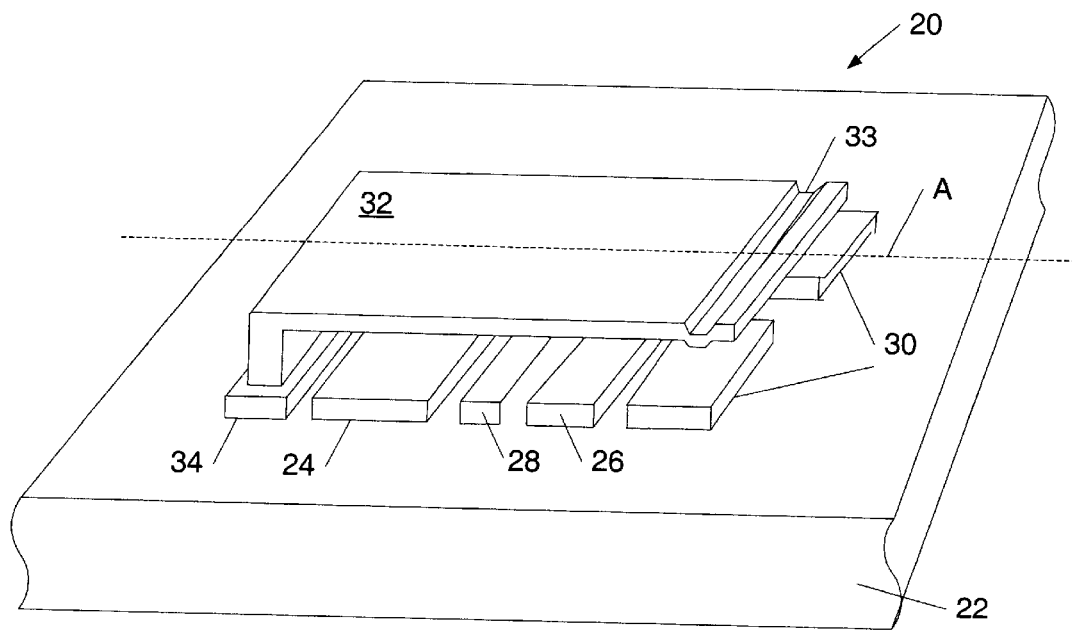
FIG. 1 depicts a perspective view of a microelectromechanical device which includes two electrodes, a fulcrum contact structure, a conductive pad spaced underneath a cantilever.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 2:
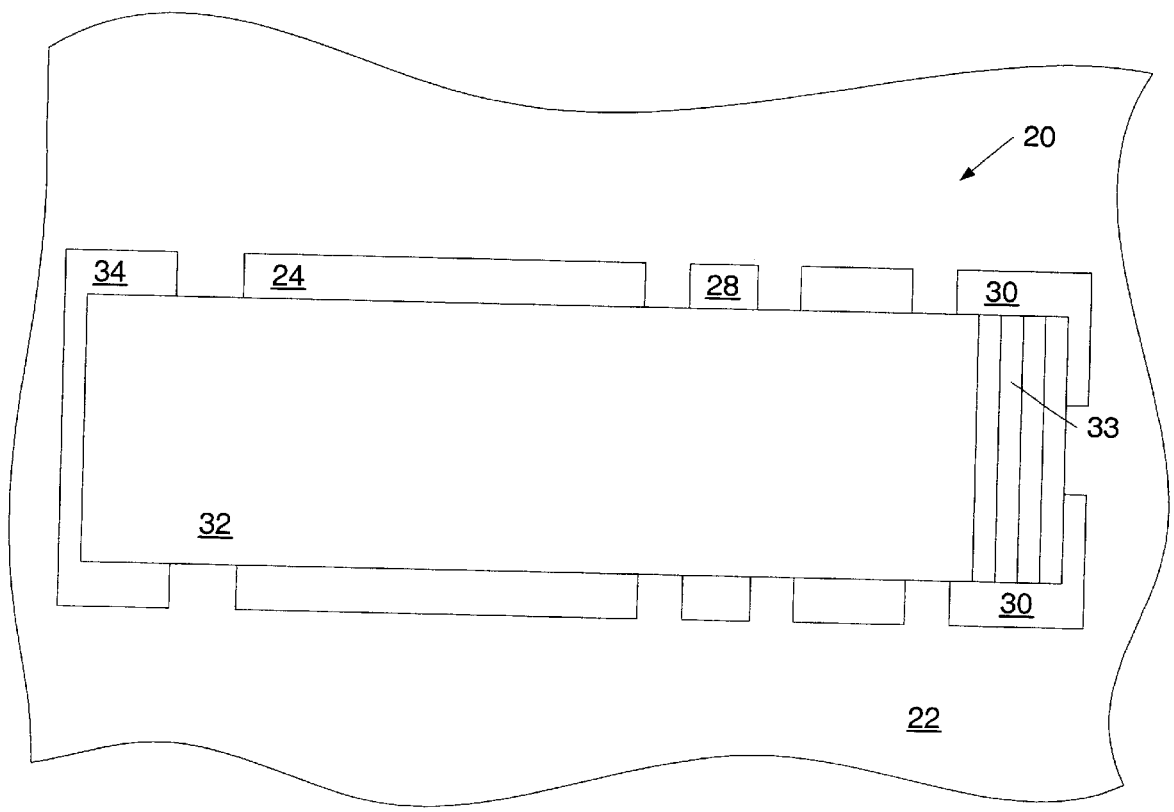
FIG. 2 depicts a top view of the microelectromechanical device of FIG. 1.
Figure 3:
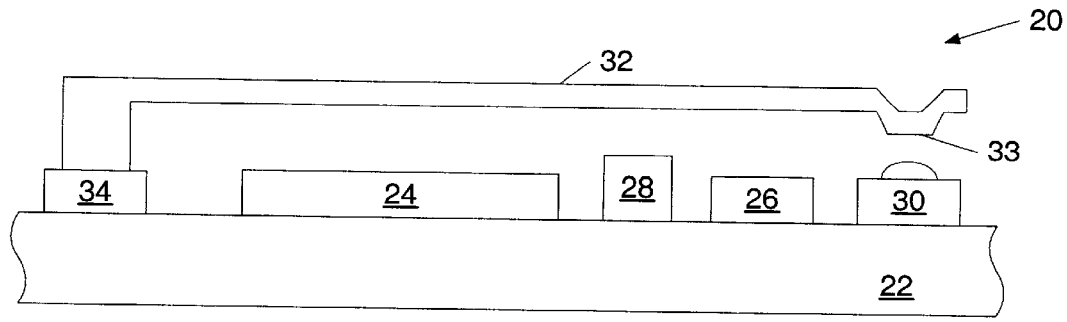
FIG. 3 depicts a partial cross-sectional view of the microelectromechanical device of FIG. 1.

Turning to the drawings, FIGS. 1–3 illustrate an exemplary embodiment of a microelectromechanical device adapted to pull a cantilever away from a conductive pad. In particular, FIG. 1 depicts a perspective view of MEMS device 20, while FIGS. 2 and 3 illustrate a top view and cross-sectional view of MEMS device 20, respectively. The cross-sectional view in FIG. 3 is taken along line A of FIG. 1. It is noted, however, that FIGS. 1–3 are not drawn to same scale. In addition, the vertical scale of FIGS. 1–9 is greatly exaggerated to emphasize the components of the devices. In general, the lateral dimensions of such devices may be on the order of tens to hundreds of microns while the vertical dimensions may be on the order of one to several microns. In the embodiment of FIGS. 1–3, MEMS device 20 is arranged upon substrate 22 with cantilever 32 spaced above gate structures 24 and 26, fulcrum contact structure 28, and conductive pad 30. In an embodiment in which substrate 22 is incorporated into an integrated circuit, substrate 22 may be a silicon or gallium arsenide substrate. More specifically, substrate 22 may be a monocrystalline silicon substrate or an epitaxial silicon layer grown on a monocrystalline silicon substrate. In addition, substrate 22 may include a silicon on insulator (SOI) layer, which may be formed upon a silicon wafer. Alternatively, substrate 22 may be glass, polyimide, metal, or any other substrate material commonly used in the fabrication of microelectromechanical devices.

Gate structures 24 and 26 may include a conductive material, such as polysilicon or metal. In particular, gate structures 24 and 26 may include gold, copper, titanium, tungsten, or alloys of such metals. In one embodiment, gate structures 24 and 26 may include the same materials. In another embodiment, gate structures 24 and 26 may include different materials. Gate structures 24 and 26 are preferably arranged under cantilever 32 such that the lengths of gate structures 24 and 26 run perpendicular to the length of cantilever 32. In this manner, gate structures 24 and 26 may extend beyond the periphery of cantilever 32 as shown in FIG. 2. Alternatively, the lengths of gate structures 24 and 26 may be substantially similar to the width of cantilever 32.

In addition, gate structures 24 and 26 may have different widths. In particular, gate structure 26 may be wider than gate structure 24. Alternatively, gate structure 24 may be wider than gate structure 26 as shown in FIG. 3. In such embodiment, fulcrum contact structure 28 may be advantageously arranged closer to the distal end of cantilever 32. In this manner, the distal end of the cantilever may more easily be deflected from the conductive pad. In an alternative embodiment, the width of gate structures 24 and 26 may be substantially the same. In some cases, gate structures 24 and 26 may be arranged symmetrically under cantilever 32. More specifically, gate structures 24 and 26 may be arranged under cantilever 32 such that there is an equal distance from the sides of the gate structures opposite to that of fulcrum contact structure 28 to the respective ends of the cantilever.

Fulcrum contact structure 28 may be arranged upon substrate 22 interposed between gate structures 24 and 26. Fulcrum contact structure 28 may include a non-conductive material such as silicon dioxide ($SiO_2$), silicon nitride ($Si_xN_y$), silicon oxynitride ($SiO_xN_y(H_2)$), or silicon dioxide/ silicon nitride/silicon dioxide (ONO). Alternatively, fulcrum contact structure 28 may include a conductive material such as gold, copper, titanium, tungsten, or an alloy of such metals. In such an embodiment, fulcrum contact structure 28 may serve as a conductive pad. In this manner, fulcrum contact structure 28 may conduct a signal transmitted through cantilever 32 when MEMS device 20 is activated to bring cantilever 32 in contact with fulcrum contact structure 28. In some embodiments, fulcrum contact structure 28 may include the same material as gate structures 24 and/or 26.

As with gate structures 24 and 26, fulcrum contact structure 28 may be arranged under cantilever 32 and may extend perpendicular to the width of cantilever 32. As such, fulcrum contact structure 28 may extend beyond the periphery of cantilever 32. Alternatively, fulcrum contact structure 28 may reside entirely under the periphery of cantilever 32. In some cases, fulcrum contact structure 28 may include multiple sections (not shown) spaced laterally adjacent to each other along the width of cantilever 32. In such an embodiment, the plurality of sections may include differing materials, particularly conductive and non-conductive materials. Alternatively, the multiple sections may include the same material. Furthermore, the upper surface of fulcrum contact structure 28 may be above the upper surfaces of gate structures 24 and 26 and conductive pad 30. Alternatively, the upper surface of fulcrum contact structure 28 may be below the upper surfaces of gate structures 24 and 26 and conductive pad 30. In another embodiment, fulcrum contact structure 28 may be approximately the same height as conductive pad 30. Such an embodiment may be particularly advantageous when fulcrum contact structure 28 serves as a conductive pad so that fulcrum contact structure 28 and conductive pad 30 may be formed simultaneously during the fabrication of MEMS device 20.

FIGS. 1–3 illustrate conductive pad 30 under the distal end of cantilever 32. Preferably, conductive pad 30 is arranged laterally adjacent to gate structure 26. In particular, conductive pad 30 may be interposed between fulcrum contact structure 28 and gate structure 26. Alternatively, gate structure 26 may be interposed between fulcrum contact structure 28 and conductive pad 30. Conductive pad 30 may include a conductive material such as those that may be used for fulcrum contact structure 28. In addition, conductive pad 30 may include a dielectric cap layer arranged upon the conductive material. Such a dielectric cap layer may include silicon dioxide ($SiO_2$), silicon nitride ($Si_xN_y$), silicon oxynitride ($SiO_xN_y(H_2)$), or silicon dioxide/silicon nitride/silicon dioxide (ONO). As with fulcrum contact structure 28, conductive pad 30 may include multiple sections as shown in FIG. 2. In this manner, a connection between the multiple pad sections may be made through cantilever 32 when cantilever 32 is actuated to contact conductive pad 30. Alternatively, conductive pad 30 may be a single structure. In either embodiment, the length of conductive pad 30 may extend perpendicular to the width of cantilever 32. As such, the outer edges of conductive pad 30 may extend beyond the periphery of cantilever 32 as shown in FIG. 2. Alternatively, conductive pad 30 may reside entirely under the periphery of cantilever 32.

Figure 4:
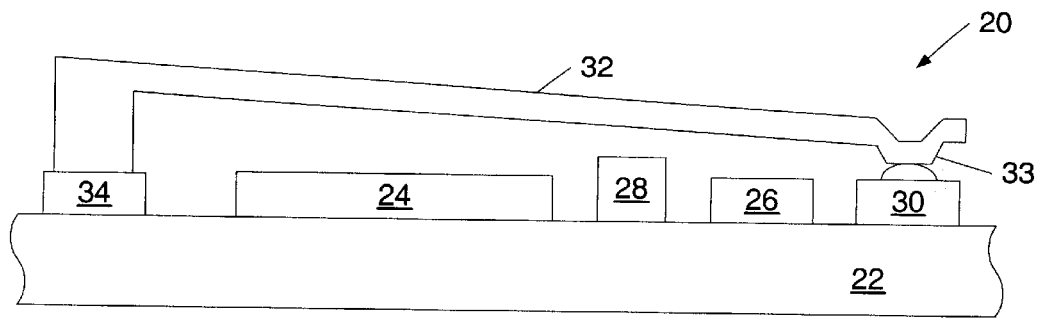
FIG. 4 depicts a partial cross-sectional view of the microelectromechanical device of FIG. 1 with the distal end of the cantilever in contact with the conductive pad.

As stated above, cantilever 32 is preferably spaced above gate structures 24 and 26, fulcrum contact structure 28, and conductive pad 30. In addition, cantilever 32 may include one or more dimpled portions. For example, cantilever 32 may include dimpled portion 33, sometimes called a "dimple", above conductive pad 30 as shown in FIG. 3. Likewise, cantilever 32 may include a dimpled portion above fulcrum contact structure 28. In one embodiment, cantilever 32 may include dimpled portions over both structures. In contrast, cantilever 32 may not include any dimpled portions. In addition or alternatively, fulcrum contact structure 28 and/or conductive pad 30 may have raised sections arranged on the top portions of the structures. Examples of such raised sections may include flat, pointed, rounded, or square bumps. In FIGS. 3–5, conductive pad 30 includes a rounded bump above its upper surface. Such raised sections and dimpled portions of the cantilever may help localize contact between the beam and the contact structures while preventing contact between the gate structures and the beam. In addition, the raised and dimpled features may help break through contamination that may reside upon the contact interface between the contact structures and the overlying portions of the beam.

Cantilever 32 may include a variety of materials. For example, cantilever 32 may include a dielectric material such as those that may be used for fulcrum contact structure 28. Alternatively or in addition, cantilever 32 may include a conductive material such as gold, copper, titanium, or tungsten. Preferably, cantilever 32 includes a material that may adequately bend in response to the introduction of an electrostatic force between one or more of the gate structures and the beam. Generally, a relatively flexible material advantageously allows the device to be actuated at a relatively low voltage. In one embodiment, cantilever 32 may include an insulating element interposed between two conductive portions of cantilever 32. In particular, the insulating element may be interposed between a conductive supported end and a conductive distal end of cantilever 32. For example, the insulating element may be interposed between the portions of cantilever 32 which reside over fulcrum contact structure 28 and conductive pad 30. In this manner, cantilever 32 may provide a connection for one signal to pass through conductive fulcrum contact structure 28 and another signal to pass through multiple sections of conductive pad 30. In one embodiment, a signal may pass through cantilever 32 to fulcrum contact structure 28. In addition, the distal end of cantilever 32 may bridge a connection between two drain regions of a circuit such that a signal may pass through them.

Cantilever 32 may be supported by support structure 34. Such a structure may be conductive or non-conductive. As such, similar materials to those used for fulcrum contact structure 28 and conductive pad 30 may be used for support structure 34. In an embodiment in which support structure 34 is conductive, support structure 34 may serve as a conductive pad similar to that of conductive pad 30. As such, the support structure 34 may be substantially the same height as gate structures 24 and 26 and conductive pad 30 as shown in FIG. 3. Alternatively, support structure 34 may be substantially higher or lower than gate structures 24 and 26 and conductive pad 30.

An exemplary embodiment of an actuation of MEMS device 20 is illustrated in FIGS. 3, 4, 5a, and 5b. In particular, FIG. 3 illustrates MEMS device 20 in a non-actuated state in which cantilever 32 is not in contact with either conductive pad 30 or fulcrum structure 28. In such an embodiment, cantilever 32 preferably includes a material stiff enough to prevent contact with fulcrum contact structure 28 and conductive pad 30 when an electrostatic charge is not applied to gate structures 24 or 26. In an embodiment, contact between cantilever 32 and conductive pad 30, as shown in FIG. 4, may be caused by electrostatically actuating gate structure 26. In other words, a voltage may be applied to gate structure 26, thereby introducing an electrostatic force to pull down cantilever 32. The applied voltage may be approximately 5 V or higher. However, the applied voltage may vary significantly depending on the dimensions and the materials used in the device.

Figure 5A:
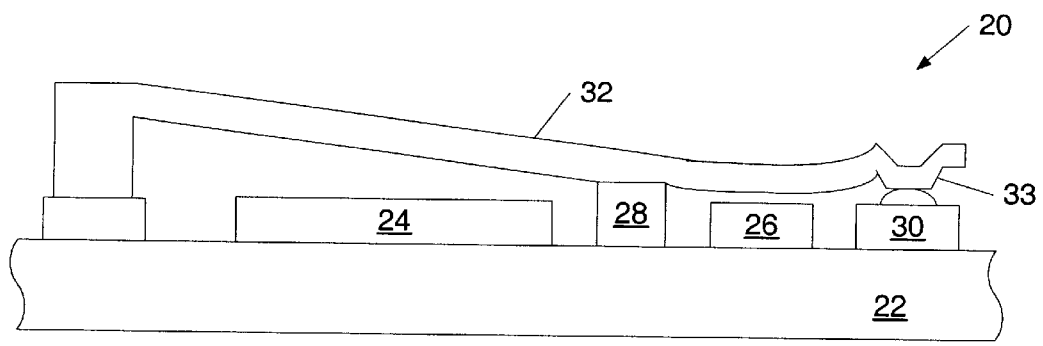
FIG. 5a depicts a partial cross-sectional view of the microelectromechanical device of FIG. 1 with the cantilever in contact with the conductive pad and the fulcrum contact structure.
Figure 5B:
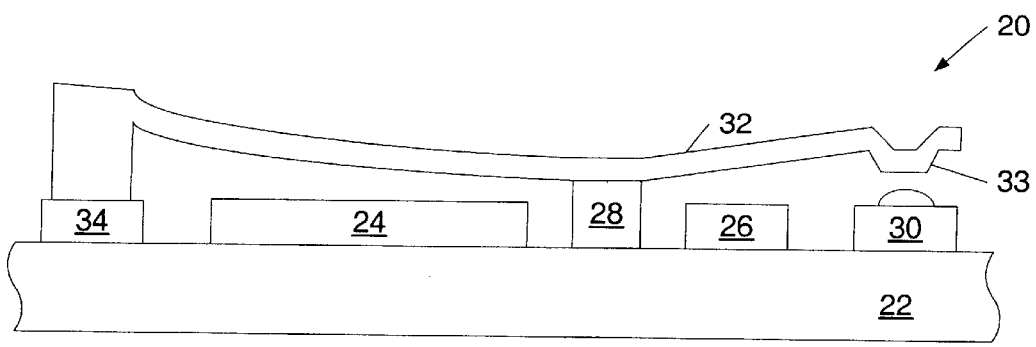
FIG. 5b depicts a partial cross-sectional view of the microelectromechanical device of FIG. 1 with the cantilever in contact with the fulcrum contact structure.

In an embodiment in which an electrostatic force is applied to gate structure 26 to bring cantilever 32 in contact with conductive pad 30, cantilever 32 may be pulled away from conductive pad 30 in a variety of manners. For example, the closing voltage may simply be disconnected from gate structure 26 to deflect cantilever 32 from conductive pad 30. However, in many cases, the release of such a voltage may not be enough to deflect cantilever 32 from conductive pad 30 due to stiction problems discussed earlier, particularly when using low voltage levels. An alternative method of pulling cantilever 32 away from conductive pad 30 is to actuate gate structure 24 to pull the cantilever into contact with fulcrum contact structure 28. Such an actuation may deflect the distal end of cantilever 32 from conductive pad 30 as shown in FIG. 5b. In such an embodiment, fulcrum contact structure 28 may act as a fulcrum for deflecting cantilever 32 from conductive pad 30.

In another embodiment, the actuation of gate structure 24 in combination with the release of the closing voltage upon gate structure 26 may pull the distal end of cantilever away from conductive pad 30. In such an embodiment, cantilever 32 preferably includes a material that may adequately bend in response to the introduction of the electrostatic force between gate structure 26 and the beam. Likewise, the material of cantilever 32 preferably allows the cantilever to bend in response to an electrostatic force between gate structure 24 and the beam. In addition, such a material may be stiff enough to prevent contact with fulcrum contact structure 28 when an electrostatic charge is not applied to gate structure 24.

The combination of actuating gate structure 24 and releasing the closing voltage from gate structure 26 may be conducted in series or simultaneously. In an embodiment in which the actuation of gate structure 24 and the release of the closing voltage on gate structure 26 are conducted in series, cantilever 32 may be in contact with fulcrum contact structure 28 and conductive pad 30 simultaneously as shown in FIG. 5a. Such an embodiment may continue to FIG. 5b upon the release of the closing voltage. An embodiment in which the actuation of gate structure 24 and the release of the closing voltage are conducted simultaneously may be depicted as a sequence in FIGS. 4 to 5b. In an alternative embodiment, MEMS device 20 may be adapted such that the deflection of cantilever 32 from conductive pad 30 may include the application of an actuation voltage to gate structure 24, the release of a closing voltage applied to gate structure 26, and a subsequent increase of the actuation voltage. The increase of the voltage to gate structure 24 may be optimized such that the minimal amount of voltage required to sufficiently deflect cantilever 32 away from conductive pad 30 may be used.

An alternative exemplary embodiment of an actuation of MEMS device 20 may be illustrated in FIGS. 4, 5a, and 5b.

In such an embodiment, residual stresses within cantilever 32 may bring the beam in contact with conductive pad 30. Consequently, FIG. 4 may depict MEMS device 20 in a non-actuated state in which cantilever 32 is in contact with conductive pad 30. In such an embodiment, cantilever 32 may be brought into contact with fulcrum contact structure 28 by an application of a closing voltage to gate structure 26 as shown in FIG. 5a. The material of cantilever 32, in such an embodiment, preferably allows the beam to bend in response to an electrostatic force between gate structure 26 and the beam. In this manner, cantilever 32 may be brought into contact with both fulcrum contact structure 28 and conductive pad 30 at the same time.

In addition or alternatively, contact with fulcrum contact structure 28, in such an embodiment, may be made by an application of an actuation voltage to gate structure 24. In this manner, the device may serve as a functional switch since contact can be made and released at fulcrum contact structure 28 by actuating either one or both gate structures 24 and 26. The application of voltages to both gate structures may allow contact to fulcrum structure 28 to be made at a lower voltage than in an embodiment in which voltage is only applied to gate structure 26. The application of the voltages in such an embodiment may be simultaneous or in series. Furthermore, an increase in the application of the actuation voltage to gate structure 24 may pull cantilever 32 away from conductive pad 30 as shown in FIG. 5b. The deflection may occur instantaneously at a preset voltage level or may occur as the voltage applied to gate structure 24 is gradually increased. Alternatively, the application of the actuation voltage may not deflect cantilever 32 away from conductive pad 30, particularly in embodiments in which a closing voltage is applied to gate structure 26.

FIGS. 6–9 illustrate other exemplary embodiments of a microelectromechanical device adapted to deflect a cantilever from a conductive pad. In particular, FIGS. 6–9 illustrate MEMS device 40 arranged upon substrate 22. MEMS device 40 may include cantilever 52 spaced above gate structures 44 and 46, fulcrum contact structure 48, and conductive pad 30. The perspective and top views of MEMS device 40 may be substantially similar to the perspective and top views of MEMS device 20 of FIGS. 1 and 2, respectively with exception to the differences in size, shape, and location of the device components as discussed below.

Figure 6:
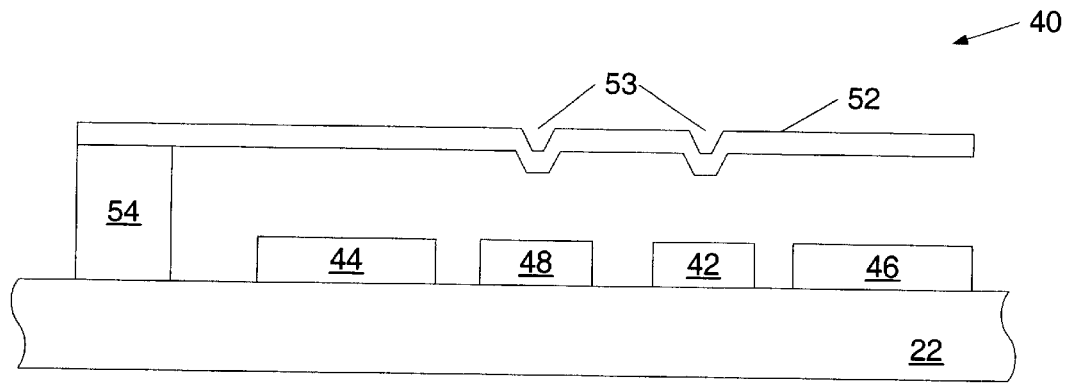
FIG. 6 depicts a partial cross-sectional view of a microelectromechanical device, in an alternative embodiment, which includes two electrodes, a fulcrum contact structure, a conductive pad spaced underneath a cantilever.

Gate structures 44 and 46 may be substantially similar to gate structures 24 and 26 of MEMS device 20 of FIGS. 1–3. As such, gate structures 44 and 46 may be spaced below cantilever 52 and arranged upon substrate 22. In addition, gate structures 44 and 46 may include substantially the same composition and dimensions as gate structures 24 and 26. Alternatively, the widths of gate structures 44 and 46 may be substantially the same as shown in FIG. 6. In either embodiment, the lengths of gate structures 44 and 46 may extend perpendicular to the width 6f cantilever 32. In some cases, gate structures 44 and 46 may extend beyond the periphery of cantilever 52. Alternatively, gate structures 44 and 46 may reside entirely under the periphery of cantilever 52. In one embodiment, gate structures 44 and 46 may be arranged symmetrically under cantilever 52. More specifically, gate structures 44 and 46 may be arranged under cantilever 52 such that there is an equal distance from the sides of the gate structures opposite to that of fulcrum contact structure 48 to the respective ends of the cantilever. In the embodiment of FIGS. 6–9, there is an equal distance from the supported end of cantilever 52 to the adjacent edge of gate structure 44 and from the distal end of cantilever 52 to the adjacent edge of gate structure 46.

Fulcrum contact structure 48 may be substantially similar to that of fulcrum contact structure 28 of MEMS device 20 of FIGS. 1–3. In particular, fulcrum contact structure 48 may include the same materials as those used for fulcrum contact structure 28. As with fulcrum contact structure 28 of FIG. 1, fulcrum contact structure 48 is preferably interposed between gate structures 44 and 46. In addition, fulcrum contact structure 48 may extend perpendicular to the width of cantilever 52. In some embodiments, fulcrum contact structure 48 may extend beyond the periphery of cantilever 52. In other embodiments, fulcrum contact structure 48 may reside entirely under the periphery of cantilever 52. Furthermore, fulcrum contact structure 48 may include multiple sections. In contrast, fulcrum contact structure 48 may be a single structure.

In the embodiment of FIGS. 6–9, fulcrum contact structure 48 is shown at an equal height to that of gate structures 44 and 46 and conductive pad 42. Larger and smaller heights, however, may be appropriate depending on the design specifications of the device. In one embodiment, fulcrum contact structure 48 may serve as a conductive pad, similar to that of conductive pad 42. In such an embodiment, a signal transmitted through cantilever 52 may be conducted through fulcrum contact structure 48 when cantilever 52 is in contact with fulcrum contact structure 48. Conductive pad 42 may be substantially similar to conductive pad 30 of FIGS. 1–5. In particular, conductive pad 42 may include the same materials and dimensions as may be used for conductive pad 30 in FIGS. 1–5. In addition, conductive pad 42 may be arranged laterally adjacent to gate structure 46. In one embodiment, gate structure 46 may be interposed between conductive pad 42 and fulcrum contact structure 48. In an alternative embodiment, conductive pad 42 may be interposed between fulcrum contact structure 48 and gate structure 46. The latter arrangement may be advantageous for contacting cantilever 52 with conductive pad 42 with a greater force than if conductive pad 42 was arranged between fulcrum contact structure 28 and gate structure 46. Alternatively, such an arrangement may require less voltage to bring cantilever 52 in contact with conductive pad 42.

Cantilever 52 may be substantially similar to that of cantilever 32 of FIGS. 1–3. As such, cantilever 52 may include the same composition as cantilever 32. In addition, cantilever 52 may include one or more dimpled portions 53 as shown in FIGS. 6–9. The dimpled portions are preferably over at least one of fulcrum contact structure 48 and conductive pad 30. In addition or alternatively, fulcrum contact structure 48 and/or conductive pad 42 may include raised sections arranged upon the upper portions of the respective structures. The raised sections may be, for example, flat, pointed, square, or rounded sections comprising a smaller area than that of the underlying base portion of the respective structure.

The raised sections of the contact structures and the dimpled portion of the cantilever, in combination or independently, may help localize the contact and prevent any contact between the gate structures and the beam. In addition, the raised and dimpled features may help break through any contamination that may reside within the contact interface between the contact structures and beam. For example, in an embodiment in which fulcrum contact structure 48 is substantially the same height as gate structures 44 and 46 and conductive pad 30, cantilever 52 may include a dimpled region over fulcrum contact structure 48 as shown in FIGS. 6–9. In such an embodiment, the combination of fulcrum contact structure 48 and the dimpled portion of cantilever 52 above fulcrum contact structure 48 may act as a fulcrum for deflecting cantilever 52 from conductive pad 42. In addition or alternatively, fulcrum contact structure 48 may include a raised section. Such configurations may insure that the distal end of cantilever 52 is sufficiently spaced from conductive pad 42 upon deflection of the beam from the conductive pad.

Cantilever 52 may be supported by support structure 54. Support structure 54 may be substantially similar to that of support structure 34 of MEMS device 20 of FIGS. 1–3. As such, support structure 54 may include similar composition and dimensions of support structure 34. Alternatively, support structure 54 may be substantially larger than support structure 34. For example, support structure 54 may extend from substrate 22 to the underside of cantilever 52 as shown in FIGS. 6–9. Larger or smaller support structures, however, may be used depending on the design specifications of the device. In some embodiments, support structure 54 may be an electrical terminal with which to transmit signals to and from cantilever 52. Alternatively, support structure 54 may be constructed from an insulating material.

Figure 7:
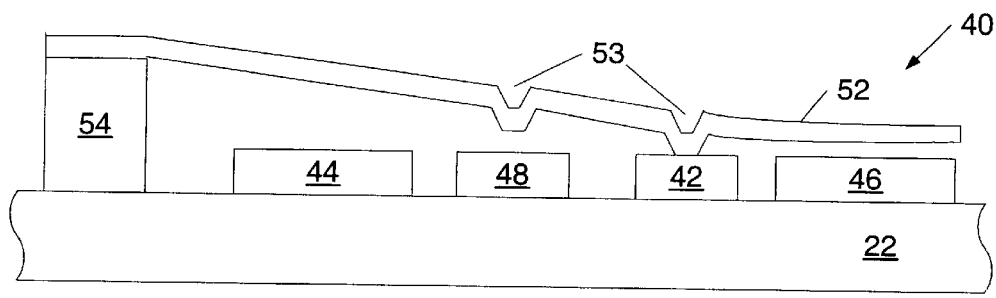
FIG. 7 depicts a partial cross-sectional view of the microelectromechanical device of FIG. 6 with the distal end of the cantilever in contact with the conductive pad.

As illustrated in FIG. 7, the distal end of cantilever 52 may be brought in contact with conductive pad 42. Such a connection may be made in the same manner as MEMS device 20. More specifically, a closing voltage may be applied to gate structure 46 such that cantilever 52 electrostatically closes conductive pad 42. Alternatively, the residual stresses contained within cantilever 52 may bring the beam in contact with conductive pad 42. In either embodiment, an actuation voltage may be applied to gate structure 44 such that cantilever 52 is deflected from conductive pad 42. In some embodiments, the deflection of cantilever 52 from conductive pad 42 may require the closing voltage applied to gate structure 46 to be released. In such an embodiment, the required actuation voltage upon gate structure 44 may be less than the actuation voltage required in an embodiment in which the actuation voltage alone causes cantilever 52 to pull away from conductive pad 42. As such, the actuation voltage may be optimized such that a minimal amount of voltage may be used. Such a voltage, however, may be required to be large enough to sufficiently deflect cantilever 52 away from conductive pad 42 upon the release of closing voltage from gate structure 46.

Figure 8:
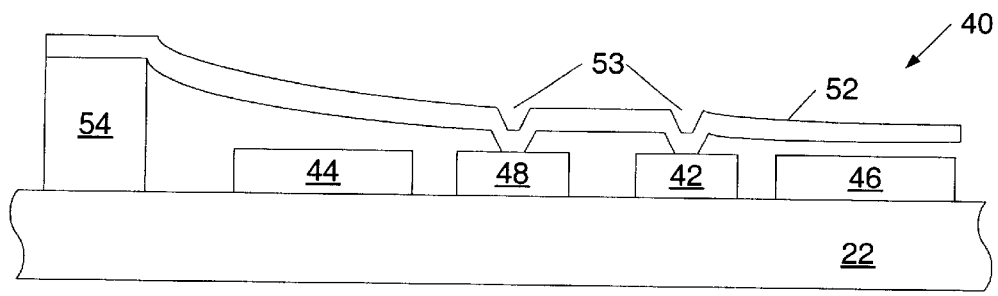
FIG. 8 depicts a partial cross-sectional view of the microelectromechanical device of FIG. 6 with the distal end of the cantilever in contact with the conductive pad and another portion of the cantilever in contact with the fulcrum contact structure.

The release of the closing voltage may occur at various times relative to the application of the actuation voltage. For example, the release of the closing voltage may be conducted simultaneously with the application of the actuation voltage such that the deflection of cantilever 52 is substantially immediate. Alternatively, the release of the closing voltage may occur in series with the application of the actuation voltage, and thus the release of closing voltage may be delayed after the application of the actuation voltage. In another embodiment, the application of the actuation voltage may occur after the release of the closing voltage. In an embodiment in which the application of the actuation voltage and the release of the closing voltage are conducted in series, cantilever 52 may be in contact with both fulcrum contact structure 48 and conductive pad 42 at the same time as shown in FIG. 8. This particular scenario may be advantageous for transmitting a signal from cantilever 52 through both fulcrum contact structure 48 and conductive pad 42 at the same time.

In an alternative embodiment, the actuation voltage may be applied to gate structure 44 before the application of the closing voltage to gate structure 46. In this manner, cantilever 52 may be brought into contact with fulcrum contact structure 48 before it is brought into contact with conductive pad 30. In another embodiment, MEMS device 40 may be activated such that cantilever 52 may be in contact only with fulcrum contact structure 48. This may be particularly advantageous in embodiments in which fulcrum contact structure 48 serves as a conductive pad.

In another embodiment, the deflection of cantilever 52 from conductive pad 42 may require an increase of the actuation voltage applied to gate structure 44 after the release of the closing voltage from gate structure 46. In such an embodiment, the required actuation voltage may be less than the actuation voltage required in an embodiment in which the actuation voltage alone causes cantilever 52 to pull away from conductive pad 42. In addition, the required actuation voltage in such an embodiment may be less than the actuation voltage required in an embodiment in which the closing voltage is released subsequent to the application of the actuation voltage.

Figure 9:
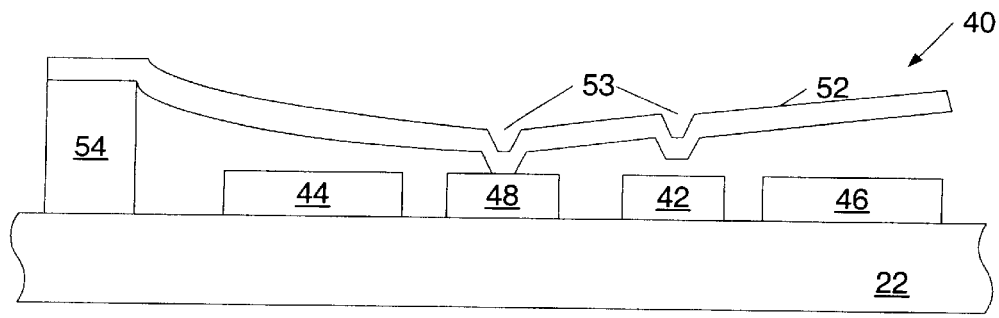
FIG. 9 depicts a partial cross-sectional view of the microelectromechanical device of FIG. 6 with the cantilever in contact with the fulcrum contact structure.

FIG. 9 illustrates an embodiment in which cantilever 52 is in contact with fulcrum contact structure 48. Such configuration may be caused by any of embodiments described above. In particular, conductive pad 42 may be electrostatically opened by the application of an actuation voltage to gate structure 44. In some cases, the electrostatic application may require additional measures to aid in the deflection of cantilever 52 from conductive pad 42. The additional measures may include releasing a closing voltage which is applied to gate structure 46 and increasing the actuation voltage subsequent to the release of the closing voltage. In another embodiment, the configuration of MEMS device 40 in FIG. 9 may be caused by the application of an actuation voltage to gates structure 44, wherein cantilever 52 was not previously connected to conductive pad 42.

In an alternative embodiment (not shown), the residual stresses within cantilever 52 may cause the distal end of the beam to curl away from conductive pad 42. Referring to FIG. 6, in this case the spacing between the dimples in cantilever 52 would be larger at contact pad 42 than at fulcrum contact structure 48. In such an embodiment, MEMS device 40 may be adapted to deflect cantilever 52 away from fulcrum contact structure 48. For example, an actuation voltage may be applied to gate structure 44 such that cantilever 52 may contact fulcrum contact structure 48. In addition or alternatively, a closing voltage applied to gate structure 46 may cause cantilever 52 to contact fulcrum contact structure 48. Such a closing voltage may be applied simultaneously or serially with the actuation voltage to gate structure 44. In some embodiments, the application and/or increase of the closing voltage to gate structure 46 may bring cantilever 52 in contact with conductive pad 42. In addition, contact of cantilever 52 with conductive pad 42 may cause cantilever 52 to pull away from fulcrum contact structure 48. In this manner, conductive pad 42 may serve as the "fulcrum" structure of the device.

Figure 10:
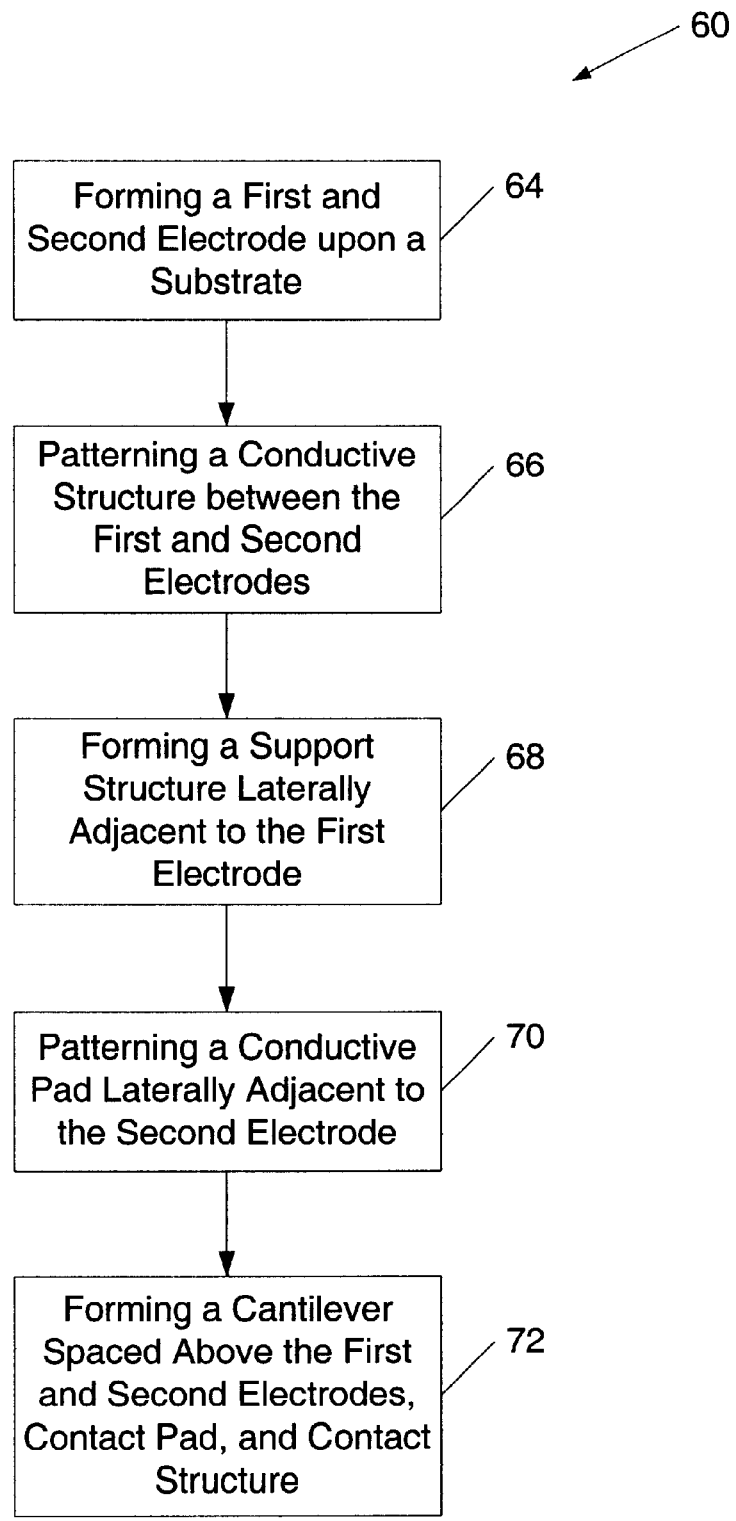
FIG. 10 depicts a flow chart of a method for forming the microelectromechanical devices of FIGS. 1 and 6.

An exemplary embodiment of a method for forming the structures of FIGS. 1–9 is depicted in the flowchart of FIG. 10. In particular, method 60 includes step 64, which includes forming a first and second electrode upon a substrate. The formation of the first and second electrodes may include patterning a conductive material and a dielectric layer disposed upon a semiconductor substrate. However, other methods commonly used for the fabrication of microelectromechanical devices may also be used. Step 66 may follow with patterning a fulcrum contact structure between the first and second electrodes. In an alternative embodiment, step 66 may precede step 64 as long as the fulcrum contact structure is arranged between the first and second electrodes. Alternatively, the first and second electrodes and the fulcrum contact structure may be formed simultaneously if they include the same materials. The next step, step 68, includes forming a support structure laterally adjacent to the first electrode, such that the first electrode is arranged between the support structure and the fulcrum contact structure. Alternatively, step 68 may be conducted prior to or after step 64. In an embodiment, the support structure may be formed in a similar manner to that of the fulcrum contact structure. In some embodiments, the support structure may be formed along with the electrodes and/or the fulcrum contact structure if they include the same materials. Alternatively, the support structure may be formed along with the cantilever as discussed below.

Method 60 may further include step 70, which includes patterning a conductive pad laterally adjacent to the second electrode. In some embodiments, the conductive pad may be in interposed between the second electrode and the fulcrum contact structure. Alternatively, the second electrode may be interposed between the conductive pad and the fulcrum contact structure. Method 60 may differ in that step 70 may be conducted before any of steps 64, 66, and 68. Alternatively, step 70 may be conducted along with the formation of the electrodes, the fulcrum contact structure, and/or the support structure if they include the same materials. Furthermore, steps 64, 66, 68, and 70 may be interchanged in any order such that the fulcrum contact structure is arranged between the first and second electrodes, the support structure is arranged laterally adjacent to the first electrode, and the conductive pad is arranged laterally adjacent to the second electrode. In an embodiment in which the fulcrum contact structure and/or the conductive pad include raised sections, the respective structures may be formed by patterning a base portion of the structure and patterning the raised section upon the upper portion of the base portion.

Step 72 may follow by forming a cantilever spaced above the first and second electrodes, conductive pad, and fulcrum contact structure. More specifically, forming the cantilever may include forming a sacrificial layer upon the first and second electrodes, conductive pad, fulcrum contact structure, and exposed portions of the substrate. Moreover, forming the cantilever may include depositing a beam layer upon the sacrificial layer, patterning the beam layer, and subsequently removing the sacrificial layer. Removing the sacrificial layer may include etch techniques commonly used in the fabrication of microelectromechanical devices such as wet etch processing. The sacrificial layer may include any material with substantially different etch characteristics than the beam layer. In an embodiment in which the cantilever is formed to include dimpled portions, forming the sacrificial layer may include conformally depositing the sacrificial layer upon the upper surface of the topography. Such a formation may further include etching portions of the sacrificial layer where the dimpled portions will be formed. Alternatively, the sacrificial layer may be formed by patterning a first sacrificial layer followed by patterning a second sacrificial upon the first sacrificial layer with recessed regions incorporated into the patterned layers.

After formation of the beam layer, the sacrificial layer may be removed, thereby freeing the cantilever for motion in response to the appropriate applied force. The steps described above may not include all steps used in forming the microelectromechanical device, and certainly do not include all steps used in forming a typical circuit containing such a device. The above-described steps may be combined with other steps used for, e.g., transistor fabrication in forming a complete circuit. Further steps may include those relating to, e.g., interconnection, passivation, and packaging of a circuit.

It will be appreciated to those skilled in the art having the benefit of this disclosure that this invention is believed to provide a microelectromechanical device adapted to electrostatically pull a cantilever away from a conductive pad. Further modifications and alternative embodiments of various aspects of the invention will be apparent to those skilled in the art in view of this description. For example, different configurations of cantilever switches may be incorporated with the aspects of the device described herein. In particular, the cantilever may have various shapes such as extensions or gaps within its structure. It is intended that the following claims be interpreted to embrace all such modifications and changes and, accordingly, the drawings and the specification are to be regarded in an illustrative rather than a restrictive sense.

What is claimed is:

1. A microelectromechanical device, comprising:

a cantilever;

first and second electrodes spaced under the cantilever;

a fulcrum contact structure interposed between the first and second electrodes and arranged under the cantilever; and a conductive pad arranged under a distal end of the cantilever and laterally adjacent to the second electrode.

2. The device of claim 1, wherein the conductive pad is interposed between the fulcrum contact structure and the second electrode.

3. The device of claim 1, wherein the second electrode is interposed between the fulcrum contact structure and the conductive pad.

4. The device of claim 1, wherein a spacing between the cantilever and the fulcrum contact structure is smaller than a spacing between the cantilever and first and second electrodes when the cantilever is not in contact with the conductive pad.

5. The device of claim 1, wherein an upper surface of the fulcrum contact structure is elevationally higher than an upper surface of the conductive pad.

6. The device of claim 1, wherein an upper surface of the fulcrum contact structure is elevationally lower than an upper surface of the conductive pad.

7. The device of claim 1, wherein the cantilever comprises a dimpled portion above at least one of the fulcrum contact structure and the conductive pad.

8. The device of claim 1, wherein at least one of the fulcrum contact structure and conductive pad comprises a raised section.

9. The device of claim 1, wherein the conductive pad comprises multiple sections spaced apart from each other.

10. The device of claim 1, wherein the fulcrum contact structure comprises multiple sections spaced apart from each other.

11. The device of claim 1, wherein a supported end of the cantilever is supported by an electrical terminal.

12. The device of claim 1, wherein the cantilever comprises an insulating element interposed between the supported end and the distal end of the cantilever.

13. A microelectromechanical device, comprising:

a cantilever;

a conductive pad arranged adjacent to the cantilever; and a plurality of components adapted to electrostatically pull the cantilever apart from the conductive pad upon an application of an actuation voltage to at least one of the plurality of components.

14. The device of claim 13, wherein the plurality of components comprises:

first and second electrodes spaced under the cantilever, wherein the conductive pad is laterally adjacent to the second electrode; and a fulcrum contact structure interposed between the first and second electrodes.

15. The device of claim 14, wherein the plurality of components is adapted to pull the cantilever apart from the conductive pad upon the application of the actuation voltage to the first electrode such that the cantilever contacts the fulcrum contact structure.

16. The device of claim 14, wherein the plurality of components is adapted to initially bring the cantilever in contact with the conductive pad by an application of a closing voltage to the second electrode.

17. The device of claim 16, wherein the plurality of components is adapted to pull the cantilever apart from the conductive pad upon:

the application of the actuation voltage to the first electrode such that the cantilever contacts the fulcrum contact structure; and a release of the closing voltage applied to the second electrode.

18. The device of claim 16, wherein the plurality of components is adapted to pull the cantilever apart from the conductive pad upon:

the application of the actuation voltage to the first electrode such that the cantilever contacts the fulcrum contact structure;

a release of the closing voltage applied to the second electrode; and an increase of the actuation voltage.

19. The device of claim 14, wherein the cantilever comprises internal residual forces adapted to bring the cantilever into contact with the conductive pad.

20. The device of claim 14, wherein the device plurality of components is adapted to bring the cantilever in contact with the fulcrum structure upon an application of a closing voltage to the second electrode.

21. The device of claim 14, wherein the plurality of components is further adapted to bring the cantilever in contact with the fulcrum structure upon:

an application of a closing voltage to the second electrode; and an application of an actuation voltage to the first electrode.

22. The device of claim 14, wherein the fulcrum contact structure comprises conductive material.

23. The device of claim 14, wherein the fulcrum contact structure is arranged under the center point of the cantilever.

24. The device of claim 14, wherein the fulcrum contact structure is arranged closer to the distal end of the cantilever than the supported end of the cantilever.

25. The device of claim 14, wherein the cantilever comprises internal residual forces adapted to curl the cantilever away from the conductive pad.

26. The device of claim 25, wherein the plurality of components is further adapted to electrostatically pull the cantilever away from the fulcrum contact structure.

27. The device of claim 25, wherein the plurality of components is adapted to pull the cantilever apart from the fulcrum contact structure upon an application of a closing voltage to the second electrode such that the cantilever contacts the conductive pad.

28. The device of claim 25, wherein the plurality of components is adapted to initially bring the cantilever in contact with the fulcrum contact structure upon an application of an actuation voltage to the first electrode and a simultaneous application of a closing voltage to the second electrode.

29. The device of claim 25, wherein the plurality of components is adapted to initially bring the cantilever in contact with the fulcrum contact structure upon an application of an actuation voltage to the first electrode.

30. The device of claim 29, wherein the plurality of components is adapted to pull the cantilever apart from the fulcrum contact structure upon:

an application of a closing voltage to the second electrode such that the cantilever contacts the conductive pad; and a release of the actuation voltage applied to the first electrode.

31. The device of claim 29, wherein the plurality of components is further adapted to pull the cantilever apart from the fulcrum structure upon:

an application of a closing voltage to the second electrode such that the cantilever contacts the conductive pad;

a release of the actuation voltage applied to the first electrode; and an increase of the closing voltage.

32. The device of claim 16, wherein the plurality of components is further adapted to simultaneously bring the cantilever in contact with both the conductive pad and the fulcrum contact structure by application of voltages to both the first and second electrodes.

* * * * *

UNITED STATES PATENT AND TRADEMARK OFFICE
CERTIFICATE OF CORRECTION

PATENT NO. : 6,646,215 B1
DATED : November 11, 2003
INVENTOR(S) : Nelson

It is certified that error appears in the above-identified patent and that said Letters Patent is hereby corrected as shown below:

Title page,
Item [73], Assignee, please delete "Teravicin" and substitute therefor -- Teravicta --.

Column 15,
Line 58, please delete "claim 1" and substitute therefor -- claim 11 --.

Column 16,
Line 38, please delete "the device plurality" and substitute therefor -- the plurality --.

Signed and Sealed this

Twenty-eighth Day of September, 2004

JON W. DUDAS
*Director of the United States Patent and Trademark Office*